(12) United States Patent  
Just et al.

(10) Patent No.: US 8,969,737 B2  
(45) Date of Patent: Mar. 3, 2015

(54) PRINTED CIRCUIT BOARD RADIO-FREQUENCY SHIELDING STRUCTURES

(71) Applicant: Apple Inc., Cupertino, CA (US)

(72) Inventors: Andrew B. Just, San Francisco, CA (US); Trent Weber, Saratoga, CA (US); Shigefumi Honjo, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 54 days.

(21) Appl. No.: 13/632,908

(22) Filed: Oct. 1, 2012

(65) Prior Publication Data

US 2013/0027897 A1      Jan. 31, 2013

Related U.S. Application Data

(63) Continuation of application No. 12/968,065, filed on Dec. 14, 2010, now Pat. No. 8,279,625.

(51) Int. Cl.
*H05K 9/00* (2006.01)
*H05K 1/02* (2006.01)
(Continued)

(52) U.S. Cl.
CPC .............. *H05K 1/0218* (2013.01); *H05K 1/147* (2013.01); *H05K 1/141* (2013.01); *H05K 1/183* (2013.01); *H05K 2201/0715* (2013.01); *H05K 2201/2009* (2013.01); *H05K 2201/2018* (2013.01); *H05K 2201/2036* (2013.01)
USPC ........... 174/350; 174/388; 174/390; 361/816; 361/818

(58) Field of Classification Search
CPC .. H01L 23/522; H05K 1/0218; H05K 9/0024; H05K 2201/10371; H05K 1/0216; G06F 1/182
USPC .......... 174/350, 378, 388, 379, 390; 361/800, 361/816, 818
See application file for complete search history.

(56) References Cited

U.S. PATENT DOCUMENTS

| | | |
|---|---|---|
| 638,820 A | 12/1899 | Swaab et al. |
| 753,796 A | 3/1904 | Jarvis et al. |

(Continued)

OTHER PUBLICATIONS

Fisher Jr. et al. U.S. Appl. No. 12/958,293, filed Dec. 1, 2010.

(Continued)

*Primary Examiner* — Angel R Estrada
*Assistant Examiner* — Dimary Lopez Cruz
(74) *Attorney, Agent, or Firm* — Treyz Law Group; G. Victor Treyz; Kendall P. Woodruff

(57) ABSTRACT

Electrical components such as integrated circuits may be mounted on a printed circuit board. To prevent the electrical components from being subjected to electromagnetic interference, a radio-frequency shielding structure may be mounted over the electrical components. The radio-frequency shielding structure may be formed from a printed circuit that includes a ground plane such as a flex circuit or rigid printed circuit board that includes at least one blanket layer of metal. The printed circuit board to which the electrical components are mounted may include a recess in which the electrical components are mounted. Additional components may be mounted to the interior and exterior surface of the radio-frequency shielding structure. The radio-frequency shielding structure may be formed from a flex circuit that has slits at its corners to accommodate folding.

15 Claims, 11 Drawing Sheets

(51) Int. Cl.
*H05K 1/14* (2006.01)
*H05K 1/18* (2006.01)

(56) References Cited

U.S. PATENT DOCUMENTS

| | | | |
|---|---|---|---|
| 4,717,990 A | 1/1988 | Tugcu | |
| 4,994,659 A | 2/1991 | Yabe et al. | |
| 5,177,324 A | 1/1993 | Carr et al. | |
| 5,316,165 A | 5/1994 | Moran, Jr. | |
| 5,461,545 A | 10/1995 | Leroy et al. | |
| 5,600,181 A | 2/1997 | Scott et al. | |
| 5,689,878 A | 11/1997 | Dahringer et al. | |
| 5,694,300 A | 12/1997 | Mattei et al. | |
| 5,761,053 A | 6/1998 | King et al. | |
| 5,981,043 A * | 11/1999 | Murakami et al. | 428/209 |
| 5,987,739 A | 11/1999 | Lake | |
| 5,990,989 A | 11/1999 | Ozawa | |
| 6,218,610 B1 | 4/2001 | Suzuki | |
| 6,326,544 B1 | 12/2001 | Lake | |
| 6,455,936 B1 | 9/2002 | Lo et al. | |
| 6,483,719 B1 | 11/2002 | Bachman | |
| 6,492,194 B1 * | 12/2002 | Bureau et al. | 438/106 |
| 6,600,101 B2 | 7/2003 | Mazurkiewicz | |
| 6,659,512 B1 | 12/2003 | Harper et al. | |
| 6,671,183 B2 | 12/2003 | Tsuzuki | |
| 6,683,245 B1 | 1/2004 | Ogawa et al. | |
| 6,733,954 B2 | 5/2004 | Yamamoto et al. | |
| 6,738,249 B1 | 5/2004 | Anthony et al. | |
| 6,940,010 B2 | 9/2005 | Cunningham et al. | |
| 6,952,046 B2 | 10/2005 | Farrell et al. | |
| 6,977,187 B2 | 12/2005 | Farrell et al. | |
| 7,089,646 B2 | 8/2006 | Leerkamp et al. | |
| 7,095,627 B2 | 8/2006 | Yokota | |
| 7,102,896 B2 | 9/2006 | Ajioka et al. | |
| 7,177,161 B2 | 2/2007 | Shima | |
| 7,180,012 B2 | 2/2007 | Tsuneoka et al. | |
| 7,214,889 B2 * | 5/2007 | Mazurkiewicz | 174/386 |
| 7,381,906 B2 | 6/2008 | Holmberg | |
| 7,446,265 B2 | 11/2008 | Krohto et al. | |
| 7,476,566 B2 | 1/2009 | Farrell et al. | |
| 7,501,587 B2 | 3/2009 | English | |
| 7,506,436 B2 | 3/2009 | Bachman | |
| 7,586,185 B2 | 9/2009 | Fukasawa | |
| 7,639,513 B2 | 12/2009 | Otsuki | |
| 7,643,311 B2 | 1/2010 | Coffy | |
| 7,649,499 B2 | 1/2010 | Watanabe | |
| 7,651,889 B2 | 1/2010 | Tang et al. | |
| 7,745,910 B1 | 6/2010 | Olson et al. | |
| 7,898,066 B1 | 3/2011 | Scanlan et al. | |
| 7,906,371 B2 | 3/2011 | Kim et al. | |
| 7,920,367 B2 | 4/2011 | Anthony et al. | |
| 7,972,901 B2 | 7/2011 | Farrell et al. | |
| 7,989,928 B2 | 8/2011 | Liao et al. | |
| 8,008,753 B1 | 8/2011 | Bolognia | |
| 8,022,511 B2 | 9/2011 | Chiu et al. | |
| 8,030,750 B2 | 10/2011 | Kim et al. | |
| 8,093,690 B2 | 1/2012 | Ko et al. | |
| 8,093,691 B1 | 1/2012 | Fuentes et al. | |
| 8,110,902 B2 | 2/2012 | Eun et al. | |
| 8,212,339 B2 | 7/2012 | Liao et al. | |
| 8,212,340 B2 | 7/2012 | Liao | |
| 2002/0119585 A1 | 8/2002 | Yamazaki et al. | |
| 2002/0153360 A1 | 10/2002 | Yamazaki et al. | |
| 2002/0192931 A1 | 12/2002 | Hayakawa | |
| 2003/0057544 A1 | 3/2003 | Nathan et al. | |
| 2004/0121602 A1 | 6/2004 | Maruyama et al. | |
| 2004/0233035 A1 | 11/2004 | Fjelstad | |
| 2004/0259389 A1 | 12/2004 | Yamazaki et al. | |
| 2005/0064685 A1 | 3/2005 | Hayakawa | |
| 2006/0086518 A1 | 4/2006 | Kawaguchi et al. | |
| 2006/0152913 A1 * | 7/2006 | Richey et al. | 361/818 |
| 2007/0120132 A1 | 5/2007 | Maruyama et al. | |
| 2008/0210462 A1 | 9/2008 | Kawagishi et al. | |
| 2009/0289548 A1 | 11/2009 | Maruyama et al. | |
| 2009/0289755 A1 | 11/2009 | Yu et al. | |
| 2010/0246143 A1 | 9/2010 | Dinh et al. | |
| 2011/0063810 A1 | 3/2011 | Chen et al. | |
| 2012/0261181 A1 * | 10/2012 | Izawa et al. | 174/378 |

OTHER PUBLICATIONS

Just et al., U.S. Appl. No. 12/968,065, filed Dec. 14, 2010.
Fisher, Jr, et al., U.S. Appl. No. 12/958,293, filed Dec. 1, 2010.
Marchese, "Macromelt Hot Melts to Shape Electronics: Introductionto Products and Technology," Henkel Loctite Adhesives, Jun. 30, 2006, Casarile, Italy (22 pages).
Henkel Electronics, "PCB Protection with Macromelt," Jan. 13, 2011. Retrieved from the Internet: <URL:http://www.youtube.com/watch?v=0yBYU$_{13}$QHibw>.
Henkel Electronics, "PCB Protection Overview," Mar. 16, 2011. Retrieved from the Internet: <URL:http://www.youtube.com/watch?v=LEsIHhpzKyc&feature=related>.
Foster et al., U.S. Appl. No. 13/488,382, filed Jun. 4, 2012.

* cited by examiner

PRINTED CIRCUIT BOARD RADIO-FREQUENCY SHIELDING STRUCTURES

This application is a continuation of U.S. patent application Ser. No. 12/968,065, filed Dec. 14, 2010, which is hereby incorporated by reference herein in its entirety. This application claims the benefit of and claims priority to U.S. patent application Ser. No. 12/968,065, filed Dec. 14, 2010.

BACKGROUND

This relates to structures for providing electromagnetic shielding for circuits such as radio-frequency circuits.

Electronic devices such as computers, cellular telephones, and other devices often contain circuitry that requires electromagnetic shielding. For example, some electronic devices include radio-frequency transceiver circuits that have the potential to generate radio-frequency interference and that are sensitive to external sources of radio-frequency interference such as interference generated by other circuits on a system board.

To prevent disruption from electromagnetic interference, circuits such as transceivers may be enclosed within metal radio-frequency (RF) shielding cans. The metal of the shielding cans blocks radio-frequency signals and helps shield the enclosed components from electromagnetic interference (EMI).

In a typical configuration, an integrated circuit such as a transceiver or other radio-frequency circuit is mounted on a printed circuit board substrate. After mounting the integrated circuit on the printed circuit board, the integrated circuit is covered by an RF shielding can. In some configurations, the shielding can has an outer metal cover that is attached to an internal frame.

Arrangements such as these may reduce electromagnetic interference within an electronic device, but tend to be bulky due to the thickness of the can. Radio-frequency shielding cans are also unable to route signals in a device.

It would therefore be desirable to provide improved radio-frequency shielding structures.

SUMMARY

Electrical components such as integrated circuits may be mounted on a printed circuit. For example, electrical components may be mounted on a rigid printed circuit board, a flexible printed circuit ("flex circuit"), or a rigid flex structure that includes flexible and rigid printed circuit areas.

The electronic components may include integrated circuits such as radio-frequency transceiver integrated circuits and other circuits that produce electromagnetic interference or that are sensitive to external sources of electromagnetic interference. To prevent normal operation of the electronic components from being disrupted, the electronic components may be covered with a radio-frequency shielding structure that blocks electromagnetic interference.

The radio-frequency shielding structure may be formed from a printed circuit that includes a shielding conductor. Printed circuit shielding structures may be formed from a printed circuit such as a flex circuit or rigid printed circuit board that includes at least one layer of shielding metal. The printed circuit to which the electrical components are mounted may include a recess in which the electrical components are mounted. Additional components may be mounted to the interior and exterior surfaces of the radio-frequency shielding structure.

A radio-frequency shielding structure may be formed from a flex circuit that has slits at its corners to accommodate folding. Frame structures such as rigid mating upper and lower frame structures may be attached to a radio-frequency shielding structure and the printed circuit to which the shielding structure is being attached to assist in mounting the shielding structure over an electronic component.

Further features of the invention, its nature and various advantages will be more apparent from the accompanying drawings and the following detailed description of the preferred embodiments.

DETAILED DESCRIPTION

This relates to radio-frequency shielding structures for electrical components. The electrical components that are shielded by the radio-frequency shielding structures may be electronic devices such as integrated circuits that operate in radio-frequency bands (e.g., transceiver integrated circuits, memory circuit and other circuits with clocks that produce signals with fundamentals or harmonics in radio-frequency bands, etc.). The electrical components that are shielded may be aggressors (components that produce radio-frequency signal interference) and/or victims (components that are sensitive to interference that is received from external sources).

The radio-frequency (RF) shielding structures may help to reduce interference from electromagnetic signals and may therefore sometimes be referred to as electromagnetic interference (EMI) shielding structures.

Figure 1:
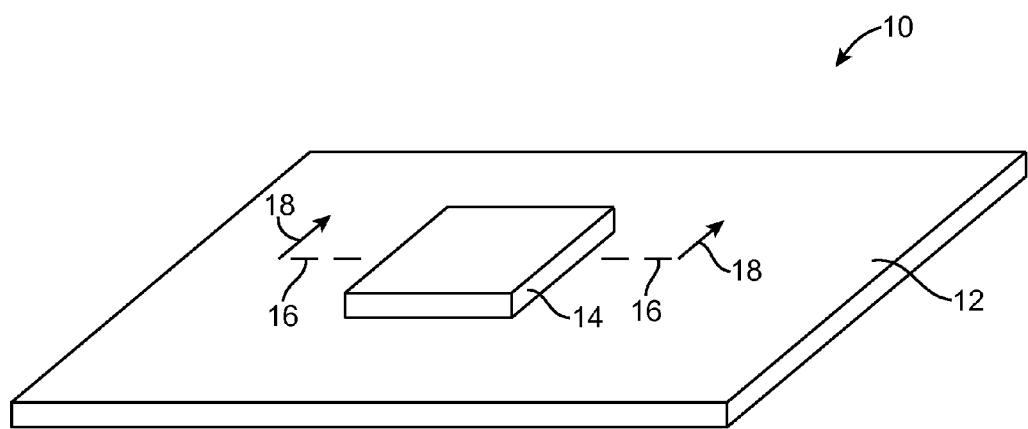
FIG. 1 is a perspective view of a conventional radio-frequency shielding can mounted on a printed circuit board.
Figure 2:
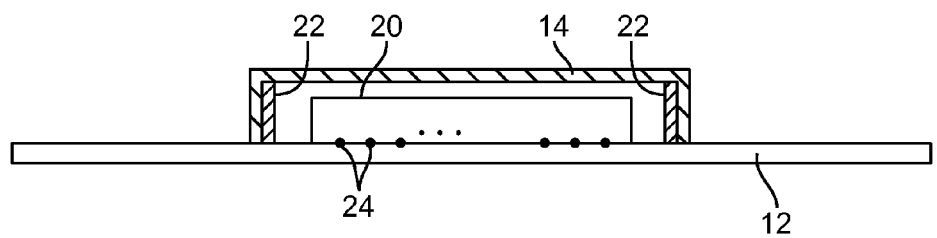
FIG. 2 is a cross-sectional side view of a conventional radio-frequency shielding can on a printed circuit board of the type shown in FIG. 1.

With conventional shielding structures, a metal can (called a shielding can) is placed over an integrated circuit that has been mounted on a circuit board. A conventional radio-frequency shielding arrangement of this type is shown in FIG. 1. As shown in FIG. 1, RF shielding can 14 is mounted on printed circuit board 12. RF shielding can 14 may be formed from stamped sheet metal. A cross-sectional side view of RF shielding can 14 taken along line 16 and viewed in direction 18 is shown in FIG. 2. As shown in FIG. 2, integrated circuit 20 can be mounted on printed circuit board using solder connections 24. Solder connections 24 connect the pins of integrated circuit 20 to corresponding metal traces in board 12. RF shielding can 14 may include an outer metal can structure that is attached to an internal frame such as frame 22. Frame 22, in turn, is mounted to board 12.

Conventional arrangements of the type shown in FIG. 2 can be somewhat bulky. For example, the thickness of a typical RF shielding structure of the type shown in FIG. 2 may be about 0.25 mm (as an example). Shielding can 14 serves exclusively as a radio-frequency shield and cannot perform other functions such as circuit mounting or signal routing functions.

To reduce size and/or increase the functionality of radio-frequency shielding structures in an electronic device, radio-frequency shielding structures may be formed from printed circuit boards. The printed circuit boards ("printed circuits") may contain metal (e.g., copper). The metal on the printed circuit board can be patterned to form traces that serve as signal lines (interconnects). The metal on the printed circuit board can also be provided in relatively large areas (e.g., areas with lateral dimensions of about 3-10 mm, 10-30 mm, or more than 30 mm) to serve as radio-frequency shielding. These large areas may cover all or substantially all of the available area on a printed circuit (e.g., as a blanket coating for forming a shielding ground plane) or may be formed in a region that is sufficiently large to serve as a localized shield but that does not cover the entire printed circuit.

When attached over an integrated circuit or other component that is to be shielded, shielding structures formed from printed circuit boards can be used to assist with signal routing tasks and/or can be used for mounting additional components.

Radio-frequency shielding structures may be formed from any suitable type of printed circuit board or boards. For example, radio-frequency shielding structures may be formed from rigid printed circuit boards (e.g., fiberglass-filled epoxy printed circuit boards such as FR4 boards), from flexible printed circuit boards ("flex circuits"), or from so-called "rigid flex" boards (i.e., boards that include both rigid portions and flexible tails).

Figure 3:
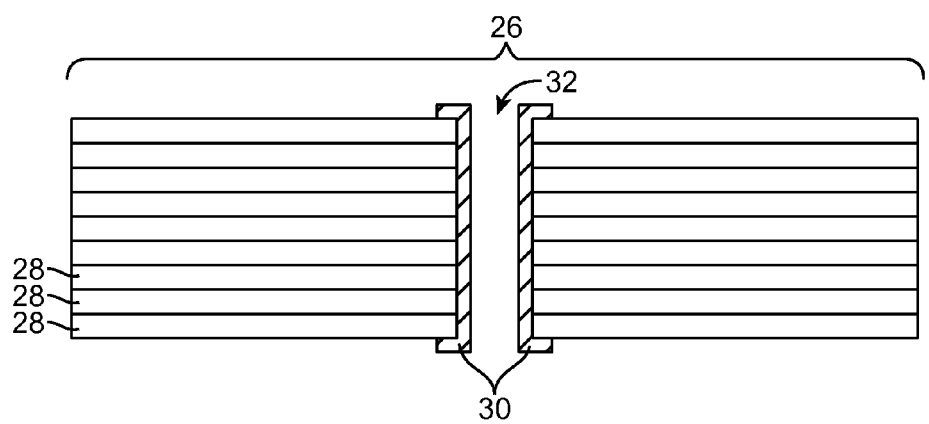
FIG. 3 is a cross-sectional side view of an illustrative printed circuit in accordance with an embodiment of the present invention.

Flex circuits may be formed from one or more layers of flexible dielectric such as layers of polyimide or other flexible polymer sheets. An illustrative printed circuit board (e.g., a flex circuit, a rigid flex board, or a rigid board) is shown in FIG. 3. As shown in FIG. 3, board 26 may contain multiple layers of material 28. Layers 28 may include layers of dielectric, layers of metal or other conductive material, and layers of adhesive. The layers of dielectric may be, for example, polymer sheets (for flex circuits), layers of epoxy, etc. Conductive material such as copper or other metals may be formed on the surfaces of the dielectric layers. The conductive material may be patterned (e.g., to form narrow signal line traces) or may be left in an unpatterned state (e.g., as a blanket layer that extends over some or all of the surface area of the printed circuit). Electroplating and other metal deposition techniques may be used in forming the metal layers in board 26. Layers of adhesive may be interposed between respective dielectric layers and their associated patterned metal traces to form a multilayer board of the type shown in FIG. 3. In multilayer boards, vias such as via 32 may be formed to interconnect traces on different layers. Vias 32 may include conductive material such plated inner layer 30 (e.g., copper).

Figure 4:
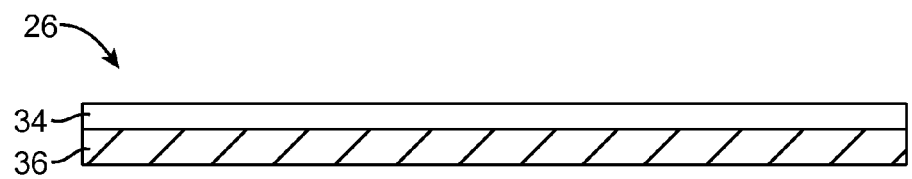
FIG. 4 is a cross-sectional side view of an illustrative printed circuit having a layer of conductor and a layer of insulator in accordance with an embodiment of the present invention.

As shown in the cross-sectional side view of FIG. 4, printed circuit board 26 (e.g., a flex circuit, rigid printed circuit board, or rigid flex structure) may include a conductive layer such as metal layer 36 that forms a coating on dielectric layer 34 and covers substantially all of the surface area of board 26. One or more layers such as layer 36 may be used to form electromagnetic shielding. In a typical configuration, layer 36, which may sometimes be referred to as a shielding layer or ground plane, may be connected to a ground voltage.

Figure 5:
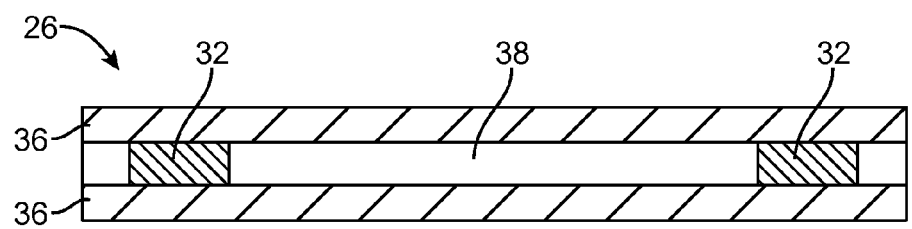
FIG. 5 is a cross-sectional side view of an illustrative printed circuit having multiple layers of conductive material interconnected by vias in accordance with an embodiment of the present invention.

The cross-sectional side view of FIG. 5 shows how printed circuit 26 may include multiple layers of conductor 36. In the example of FIG. 5, printed circuit 26 includes an upper layer 36 and a lower layer 36 that can serve as shielding layers. Conductive vias such as vias 32 may be used to interconnect shielding layers such as layers 36 in FIG. 5. Additional layers of printed circuit board material may be included in printed circuit board 26 if desired. The one-metal-layer and two-metal-layer configurations of FIGS. 4 and 5 are merely illustrative.

Figure 6:
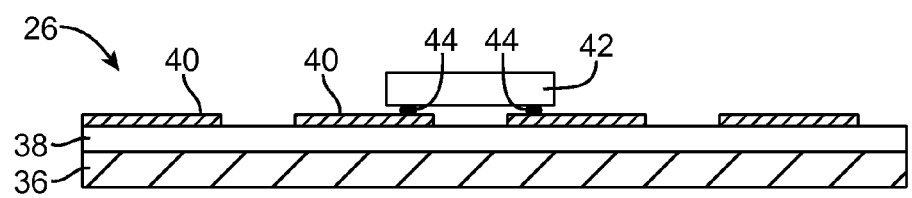
FIG. 6 is a cross-sectional side view of an illustrative printed circuit having a blanket conductive coating that can serve as a shield layer and having a surface covered with patterned conductive traces to which integrated circuits and other components may be mounted in accordance with an embodiment of the present invention.

Printed circuit boards such as printed circuit boards 26 of FIGS. 4 and 5 contain sufficient conductive material to serve as radio-frequency shields for components such as integrated circuits. In some configurations, it may be desirable to mount one or more additional integrated circuits on one or both sides of a printed circuit board that is serving as a radio-frequency shielding structure. This type of arrangement is shown in FIG. 6. As shown in FIG. 6, shielding printed circuit board 26 may have one or more shield layers such as conductive layer 36 and one or more dielectric layers such as layer 38. One or more layers of patterned traces such as traces 40 may serve as signal interconnect lines and may be electrically connected to additional integrated circuits such as integrated circuit 42 using connections 44 (e.g., solder, conductive adhesive, etc.).

Figure 7:
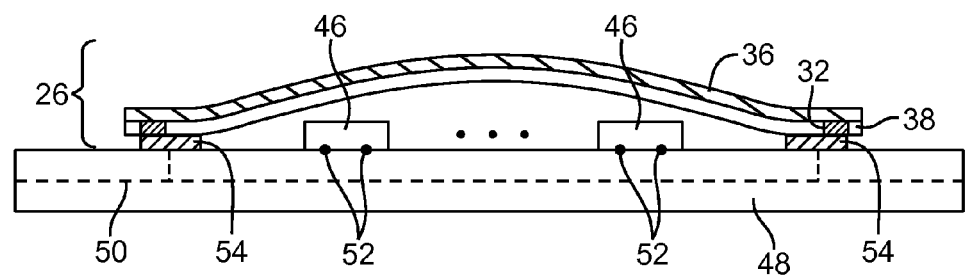
FIG. 7 is a cross-sectional side view of a flexible printed circuit that serves as a radio-frequency shield for components such as integrated circuits that are covered by the flexible printed circuit in accordance with an embodiment of the present invention.

To provide electromagnetic shielding, printed circuit board 26 may be used to cover one or more integrated circuits or other components. An illustrative configuration in which a flex circuit (or the flexible part of a rigid flex circuit) is being used to provide electromagnetic shielding in this way is shown in FIG. 7. As shown in FIG. 7, integrated circuits 46 may be mounted to printed circuit board 48 (e.g., a flex circuit, rigid printed circuit board, or rigid flex) using connections 52 (e.g. solder or conductive adhesive). Internal interconnect traces and ground plane layers such as traces and conductive layer 50 may be used to create interconnects and a ground plane for board 48.

Figure 8:
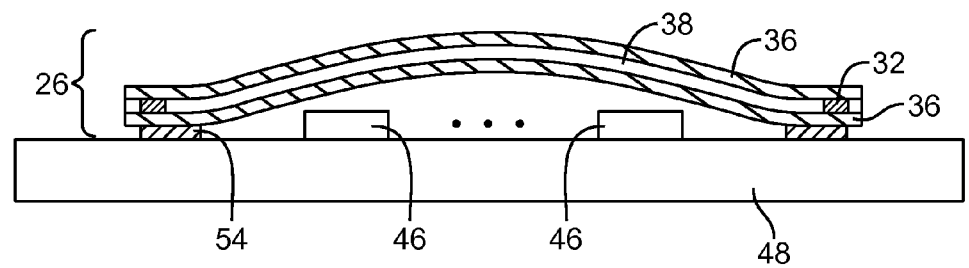
FIG. 8 is a cross-sectional side view of a flexible printed circuit with multiple conductive layers and vias that serves as a radio-frequency shield for components such as integrated circuits that are covered by the flexible printed circuit in accordance with an embodiment of the present invention.

Flex circuit 26 may be bent or otherwise flexed so as to cover the upper surfaces of components 46. Flex circuit 26 of FIG. 7 may, for example, have a conductive layer such as layer 36 and a flexible dielectric layer such as dielectric layer 38 (e.g., a sheet of polyimide). Vias such as vias 32 may be used to electrically connect conductive layer 36 to connections 54 (e.g., connections formed from solder or conductive adhesive). Connections 54, in turn, may be electrically connected to traces such as traces 50 (e.g. patterned interconnect traces on the surface of flex circuit 26, a ground plane layer that covers all or a substantial portion of board 48, etc.). FIG. 8 shows an arrangement in which flex circuit 26 has multiple conductive layers 36. In general, flex circuit 26 may contain one layer, two layers, three layers, or more than three layers of dielectric and conductor (see, e.g., layers 28 of FIG. 3).

Figure 9:
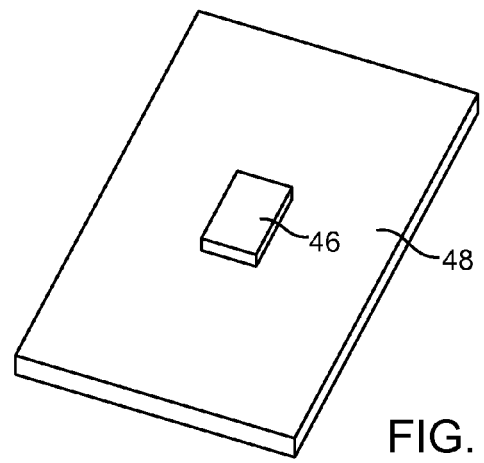
FIG. 9 is a perspective view of a component such as an integrated circuit mounted to a printed circuit board in accordance with an embodiment of the present invention.
Figure 10:
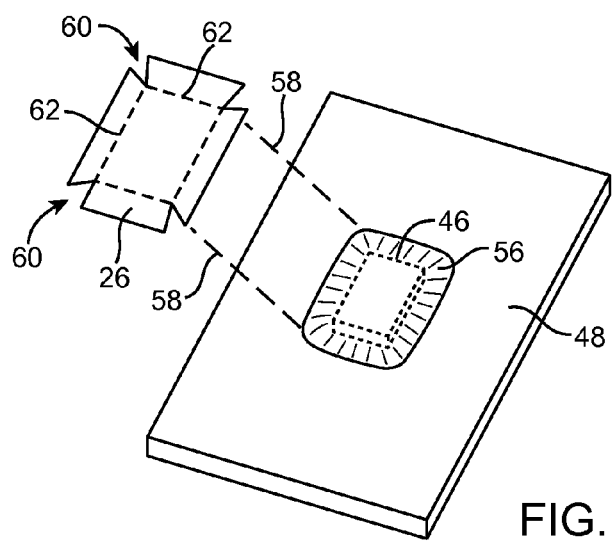
FIG. 10 is an exploded perspective view of the component of FIG. 9 and an associated flexible printed circuit that may be mounted over the component in accordance with an embodiment of the present invention.
Figure 11:
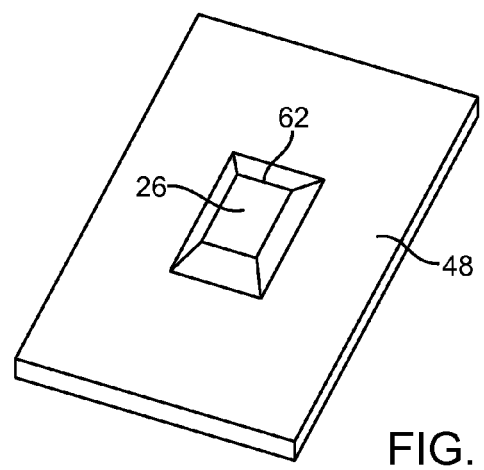
FIG. 11 is a perspective view of the flexible printed circuit of FIG. 10 mounted over the component of FIG. 9 to serve as an electromagnetic shield for the component in accordance with an embodiment of the present invention.

FIGS. 9, 10, and 11 illustrate how flex circuit 26 may be provided with features such as corner slits that help flex circuit 26 conform to the shape of an underlying component when flex circuit 26 is being used as radio-frequency shielding and is being flexed to cover the component.

FIG. 9 is a perspective view showing how integrated circuit 46 may be mounted on printed circuit board 48 (e.g., using solder or conductive adhesive connections that interconnect the pins of integrated circuit 46 to traces on printed circuit board 48, as described in connection with FIG. 7).

If desired, thermal grease or other material may be placed over integrated circuit 46, as shown by thermal compound 56 of FIG. 10. As indicated by dashed lines 58, flex circuit 26 may be mounted on board 48 so that flex circuit 26 flexes and covers integrated circuit 46 and thereby serves as a radio-frequency shield. Integrated circuit 46 may be packaged in a package that has the shape of a thin rectangular box (as an example). Flex circuit 26 may be flexed to form a matching shield shape.

To help ensure that the flexible material of flex circuit 26 is able to conform to the shape of integrated circuit 46, flex circuit 26 may be provided with one or more slits 60 (e.g., at each of the four corners of the substantially rectangular piece of flex circuit material shown in FIG. 10). Slits 60 may have triangular shapes or other notched shapes that allow flex circuit 26 to conform to the shape of integrated circuit 46. Slits 60 may, for example, allow flex circuit 26 to fold along lines 62 to form an open-sided box (i.e., a box with an open bottom) that covers integrated circuit 46.

Figure 12:
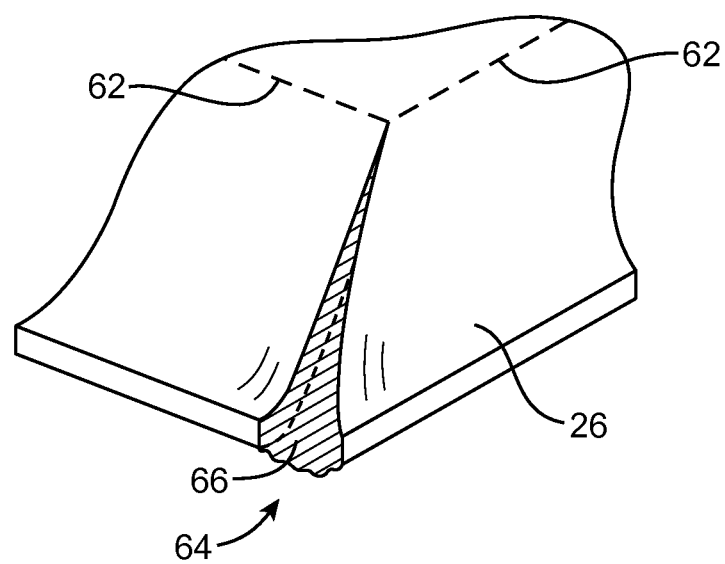
FIG. 12 is a perspective view of a corner portion of the flexible printed circuit of FIG. 11 in accordance with an embodiment of the present invention.

FIG. 11 shows how flex circuit 26 may be mounted over the integrated circuit on board 48 by folding its sides along lines 62. FIG. 12 is a perspective view of one of the corners of flex circuit 26 of FIG. 11. As shown in FIG. 12, corner 64 may optionally be filled with conductive material 66 (e.g., conductive adhesive, solder, etc.) to help ensure that flex circuit 26 provides sufficient radio-frequency shielding. Small gaps and openings in flex circuit 26 (i.e., openings significantly smaller than a wavelength in size) may sometimes be acceptable, because radiation does not readily penetrate through such small features (i.e., because the flex circuit is serving as a Faraday cage).

Figure 13:
FIG. 13 is a cross-sectional side view of a printed circuit such as a flexible printed circuit that may be used as an electromagnetic shield for a component such as an integrated circuit in accordance with an embodiment of the present invention.

FIGS. 13, 14, 15, and 16 are side views that illustrate how a flex circuit may be provided with frame structures that can be used in attaching the flex circuit over an integrated circuit to serve as a radio-frequency shield. As shown in FIG. 13, flex circuit 26 may contain one or more layers of metal 36 (e.g., copper) and dielectric 38 (e.g., a flexible sheet of polyimide or other polymer).

Figure 14:
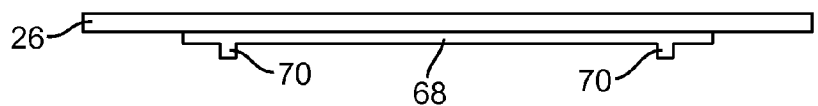
FIG. 14 is a cross-sectional side view of the printed circuit of FIG. 13 to which a frame structure has been mounted in accordance with an embodiment of the present invention.

FIG. 14 shows how a frame structure such as upper frame 68 may be attached to the lower surface of flex circuit 26 (e.g., using solder, conductive adhesive, etc.). Upper frame 68 may be formed from plastic, metal, other materials, or combinations of these materials. Upper frame 68 may contain one or more engagement features for mating with lower frame structures. For example, upper frame 68 may include one or more legs such as legs 70.

Figure 15:
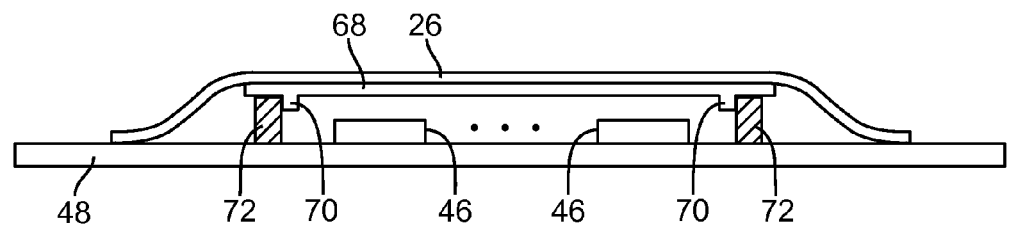
FIG. 15 is a cross-sectional side view of a flexible printed circuit and frame of the type shown in FIG. 14 following mounting of the flexible printed circuit and frames to mating frame structures on a printed circuit board to cover a component such as an integrated circuit in accordance with an embodiment of the present invention.

A shown in FIG. 15, upper frame 68 may be connected to frame structures in a lower frame such as posts 72. Posts 72 and legs 70 may have mating features, such as grooves, protrusions, etc. Adhesive, screws, or other attachment mechanisms may be used in securing frame 68 (and therefore flex circuit shield 26) to printed circuit board 48 over integrated circuits 46.

Figure 16:
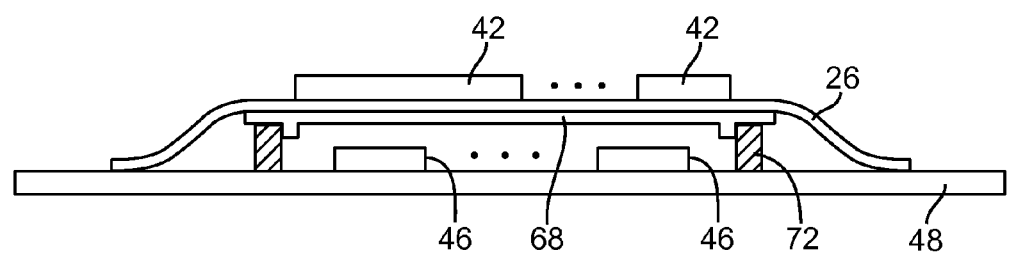
FIG. 16 is a cross-sectional side view of the flexible printed circuit and shielded components of FIG. 15 showing how additional components such as additional integrated circuits may be mounted to the exposed exterior surface of the flexible printed circuit in accordance with an embodiment of the present invention.

If desired, additional integrated circuits 42 may be mounted to flex circuit 26, as shown in FIG. 16. Integrated circuits 42 may have pins that are connected to signal traces in flex circuit 26. These signal traces may, in turn, be connected to signal traces on board 48 (e.g. using solder connections at the ends of flex circuit 26, using connectors, using conductive adhesive, etc.).

Figure 17:
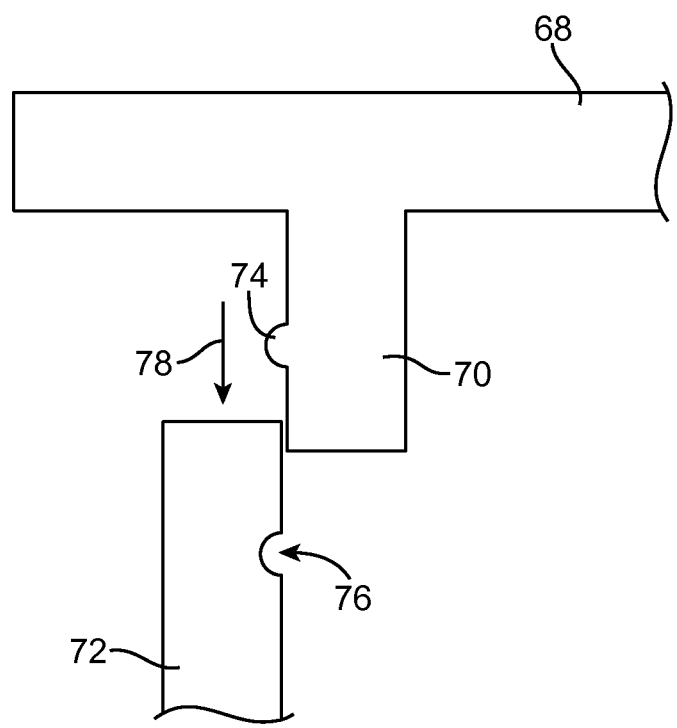
FIG. 17 is a cross-sectional side view of illustrative snap structures that may be used in interconnecting a frame structure on a flexible printed circuit and a frame structure on a rigid printed circuit board to which an integrated circuit has been mounted under the flexible printed circuit in accordance with an embodiment of the present invention.

FIG. 17 shows how each leg 70 of upper frame structures 68 may have engagement features such as protrusion 74 that mate with corresponding engagement features such as recess 76 in post 72 (or vice versa). During assembly, flex circuit 26 and upper frame 68 may be pressed downwards in direction 78 to snap upper frame 68 onto lower frame 72. During rework operations, frame 68 may be removed in the opposite direction.

Figure 18:
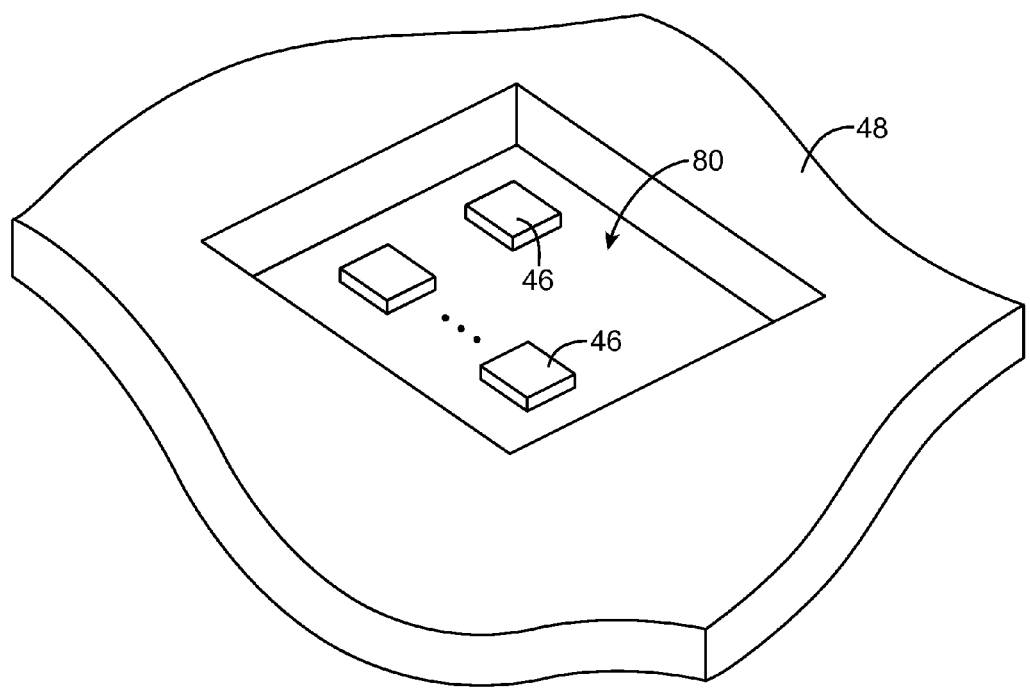
FIG. 18 is a perspective view of an illustrative printed circuit board having a recessed area into which components such as integrated circuits have been mounted in accordance with an embodiment of the present invention.

As shown in FIG. 18, printed circuit board 48 may have a recess such as recess 80 into which integrated circuits 46 or other components may be mounted (e.g., using solder, conductive adhesive, etc.). Recess 80 may have a rectangular outline as shown in FIG. 18 or may have other suitable shapes.

Figure 19:
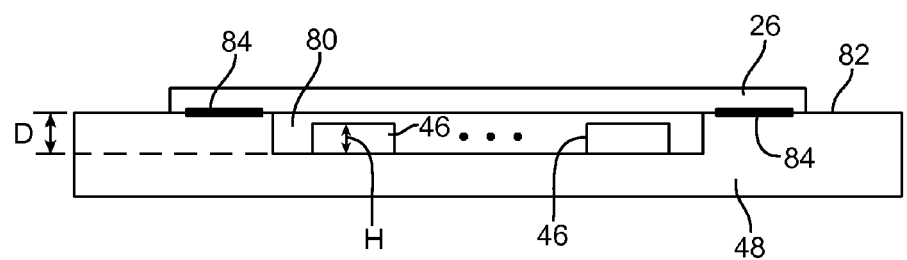
FIG. 19 is a cross-sectional side view of an illustrative printed circuit board having a recessed area into which components such as integrated circuits have been mounted in a configuration in which the opening of the recess has been covered with a radio-frequency shielding structure formed from a printed circuit such as a flexible printed circuit board in accordance with an embodiment of the present invention.

As shown in the cross-sectional side view of FIG. 19, printed circuit board 26 (e.g., a flex circuit, rigid flex, or rigid printed circuit board) may be mounted over the opening in printed circuit board 48 that is formed by recess 80. On surface 82 on board 48 around the periphery of board 26, connections such as connections 84 (e.g., solder connections, conductive adhesive, etc.) may be used to electrically connect metal layers 38 in printed circuit board 26 to conductive traces in printed circuit board 48 (e.g., ground traces that form a ground plane in board 48). The depth D of recess 80 may be configured so as to exceed height H of integrated circuits 46. Thermal grease or other suitable materials may be placed within the cavity formed by recess 80 to help remove heat from integrated circuits 46.

Figure 20:
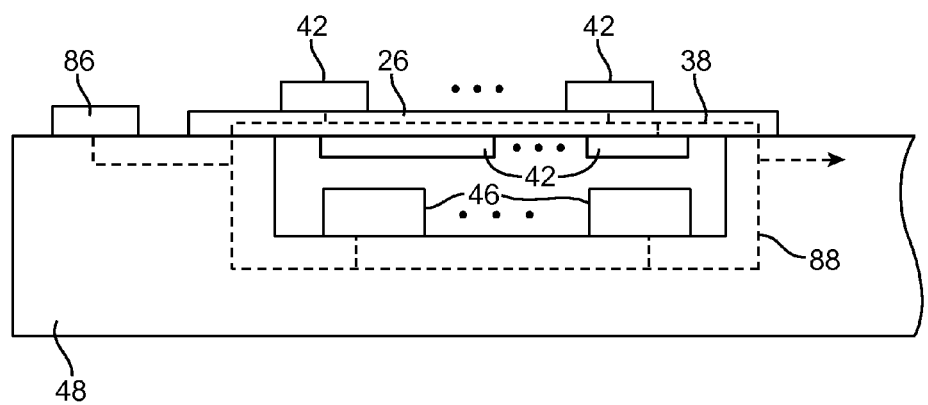
FIG. 20 is a cross-sectional side view of an illustrative printed circuit board having a recessed area into which components such as integrated circuits have been mounted and that has been provided with a radio-frequency shielding structure formed from a printed circuit board such as a flexible printed circuit board that covers the recessed area and on which integrated circuits or other components have been mounted in accordance with an embodiment of the present invention.

FIG. 20 is a cross-sectional side view of an illustrative configuration in which printed circuit board 26 (e.g., a flex circuit, rigid flex, or rigid printed circuit board) has been provided with integrated circuits 42 on both sides and has been mounted over recess 80 in printed circuit board 48 to serve as a radio-frequency shielding structure for integrated circuits 46. Because integrated circuits 42 or other components have been mounted on both the upper and lower surfaces of printed circuit board 26, packing density may be increased. Traces 88 may be used to interconnect traces 38 in board 26 to control circuitry (e.g., control circuitry in one of circuits 46 or elsewhere in an electronic device). In the event that someone tampers with board 26 (e.g., by removing board 26 from boards 48 to expose circuits 46), an open circuit between traces 38 and traces 88 may be detected by the control circuitry and appropriate action may be taken (e.g. an alert can be generated for a user by the control circuitry, the control circuitry can be used in disabling functions associated with circuits 46, etc.).

The foregoing is merely illustrative of the principles of this invention and various modifications can be made by those skilled in the art without departing from the scope and spirit of the invention.

What is claimed is:

1. Apparatus, comprising:
    an electronic component mounted to a substrate; and
    a radio-frequency shield for the electronic component that is formed from a non-planar layer of polymer coated with a layer of metal, wherein the non-planar layer of polymer coated with the layer of metal has a substantially rectangular shape with corner slits, and wherein the corner slits are filled with a conductive material.

2. The apparatus defined in claim 1 wherein the non-planar layer of polymer comprises a flexible polymer layer.

3. The apparatus defined in claim 1 wherein the non-planar layer is configured to cover the electronic component.

4. The apparatus defined in claim 1 wherein the non-player layer of metal comprises polyimide.

5. The apparatus defined in claim 1 wherein the electronic component has a shape and wherein the non-player layer of polymer coated with the layer of metal at least partially conforms to the shape of the electronic component.

6. The apparatus defined in claim 1 wherein the non-planar layer of polymer coated with the layer of metal comprises a top surface, four side surfaces, and four corner slits that accommodate folding of the four side surfaces relative to the top surface, each corner slit located between a respective pair of the four side surfaces.

7. Apparatus, comprising:
    an integrated circuit that has a shape and that is mounted to a substrate; and
    a radio-frequency shield for the integrated circuit, wherein the radio-frequency shield comprises a layer of polymer, wherein the layer of polymer has opposing first and second surfaces, wherein each of the first and second surfaces is coated with a layer of metal, wherein the radio-frequency shield at least partially conforms to the shape of the integrated circuit, and wherein the radio-frequency shield has at least one slit.

8. The apparatus defined in claim 7 wherein the polymer comprises flexible polymer.

9. The apparatus defined in claim 7 wherein the polymer comprises polyimide.

10. The apparatus defined in claim 7 wherein the layer of polymer coated with the layer of metal has a substantially rectangular shape with corner slits.

11. The apparatus defined in claim 10 wherein the layer of polymer coated with the layer of metal comprises a top surface, four side surfaces, and four corner slits that accommodate folding of the four side surfaces relative to the top surface, each corner slit located between a respective pair of the four side surfaces.

12. The apparatus defined in claim 7 wherein the radio-frequency shield comprises a plurality of bent edges.

13. An electromagnetic shield for an electronic component, comprising:
    a flexible layer of polymer;
    a flexible conductive layer that covers at least a portion of the flexible layer of polymer and that shields the electronic component from electromagnetic interference, wherein the electromagnetic shield has a first surface that faces the electronic component and a second surface that faces away from the electronic component, wherein additional electronic components are mounted on the second surface, and wherein the flexible conductive layer comprises signal traces connected to the additional electronic components.

14. The electromagnetic shield defined in claim 13 wherein the polymer comprises polyimide.

15. The electromagnetic shield defined in claim 13 wherein the flexible layer of polymer and the flexible conductive layer have a substantially rectangular shape.

* * * * *

UNITED STATES PATENT AND TRADEMARK OFFICE
CERTIFICATE OF CORRECTION

| | | |
|---|---|---|
| PATENT NO. | : 8,969,737 B2 | Page 1 of 1 |
| APPLICATION NO. | : 13/632908 | |
| DATED | : March 3, 2015 | |
| INVENTOR(S) | : Andrew B. Just et al. | |

It is certified that error appears in the above-identified patent and that said Letters Patent is hereby corrected as shown below:

In the Claims

In claim 4, column 8, line 1, delete "wherein the non-player" and insert --wherein the non-planar--.

In claim 5, column 8, line 4, delete "wherein the non-player" and insert --wherein the non-planar--.

Signed and Sealed this
Fourth Day of August, 2015

Michelle K. Lee
*Director of the United States Patent and Trademark Office*